(12) United States Patent
Sumiyoshi et al.

(10) Patent No.: US 6,201,426 B1
(45) Date of Patent: Mar. 13, 2001

(54) PULSE GENERATION DEVICE HAVING INTEGRATING CIRCUIT HAVING SUBSTANTIALLY CONSTANT CHARGING/DISCHARGING RATIO

(75) Inventors: Hajime Sumiyoshi, Fukaya; Takeshi Namikawa, Hiki-gun, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/393,679

(22) Filed: Sep. 10, 1999

(30) Foreign Application Priority Data

Sep. 14, 1998 (JP) .................................................. 10-260188

(51) Int. Cl.[7] .................................................... H03K 3/00
(52) U.S. Cl. ........................................... 327/291; 327/227
(58) Field of Search .................................... 327/229, 230, 327/227, 131, 291

(56) References Cited

U.S. PATENT DOCUMENTS

| 5,394,020 | 2/1995 | Nienaber | 327/140 |
| 5,914,591 | * 6/1999 | Yasuda et al. | 323/284 |

* cited by examiner

*Primary Examiner*—Toan Tran
*Assistant Examiner*—Linh Nguyen
(74) *Attorney, Agent, or Firm*—Oblon, Spivak, McClelland, Maier & Neustadt, P.C.

(57) ABSTRACT

A pulse generating device generates an output pulse by controlling the amplitude of a triangular wave at a constant level by use of an AGC circuit and wave-shaping the triangular wave when the triangular wave is generated by triggering a monostable multivibrator circuit by an input pulse, driving an integrating circuit having substantially the constant charging/discharging ratio by an output of the monostable multivibrator circuit, and controlling a current source which supplies a current to the integrating circuit according to an output of comparison between the integrated output and a reference voltage.

20 Claims, 7 Drawing Sheets

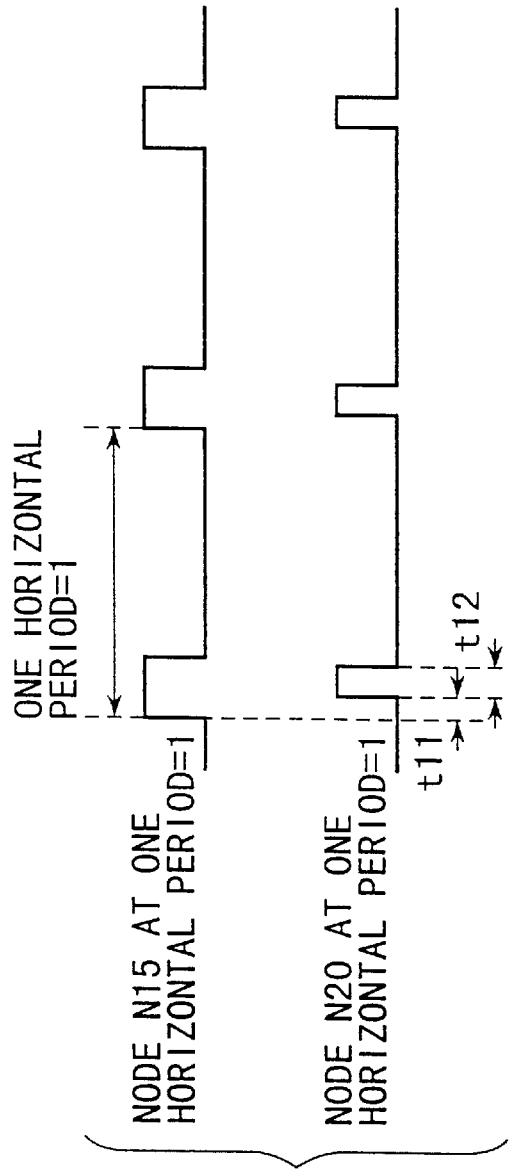
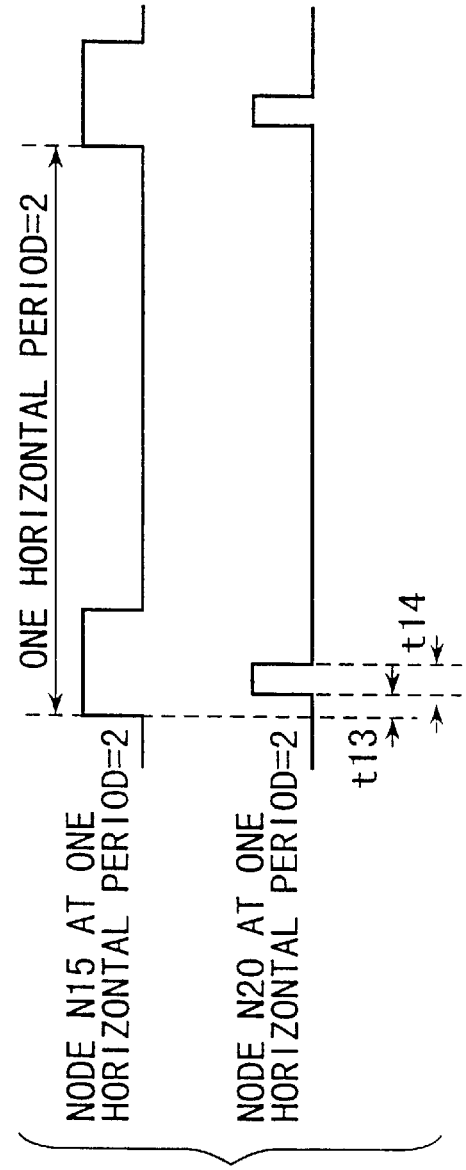

PULSE GENERATION DEVICE HAVING INTEGRATING CIRCUIT HAVING SUBSTANTIALLY CONSTANT CHARGING/ DISCHARGING RATIO

BACKGROUND OF THE INVENTION

This invention relates to a pulse generation device and more particularly to a pulse generation device for newly generating a pulse based on a fly-back pulse generated in a television receiver.

FIG. 7 is a circuit diagram showing a conventional pulse generation device. A basic pulse which is used as the basis of a pulse to be created is input to an integrating circuit 22 via an input terminal 28 or a node N15. A comparing circuit 23 is supplied with a signal at the non-inverting input terminal or a node N16 thereof from the integrating circuit 22. Further, the inverting input terminal thereof is supplied with a reference voltage Vref9. The output of the comparing circuit 23 is connected to the input or an node N17 of a buffer circuit 24. The output of the buffer circuit 24 is connected to an output terminal 27 or a node N20 of the pulse generating device via a resistor R7 and further connected to the input of an integrating circuit 25. A signal from the integrating circuit 25 is input to the non-inverting input terminal or a node N18 of a comparing circuit 26. The inverting input terminal thereof is supplied with a reference voltage Vref10. An output of the comparing circuit 26 is supplied to the node N19 or the base of an NPN transistor Q15. The collector of the transistor Q15 is connected to the output terminal 27 of the pulse generating device and the emitter thereof is connected to a ground potential node GND.

FIG. 8 is a waveform diagram showing signal waveforms of various node portions, for illustrating the operation of the pulse generating device of FIG. 7. Slice levels by the reference voltages Vref9, Vref10 are shown together with the integrated waveforms at output nodes N16 and N18 of the respective integrating circuits 22 and 25. A waveform at the output node N17 of the comparing circuit 23 is a pulse waveform which is set at a high level in a period when the level of the integrated waveform is higher than the slice level of the reference voltage Vref9. A waveform at the output node N18 of the integrating circuit 25 is obtained by integrating an output of the comparing circuit 23 by use of a resistor R6 and capacitor C5 of the integrating circuit 25. A waveform at the output node N19 of the comparing circuit 26 is a pulse waveform which is set at a high level in a period when the level of the integrated waveform is higher than the reference voltage Vref10.

By adding together the output of the comparing circuit 23 and an output obtained by inverting the output of the comparing circuit 26 by use of the transistor Q15, a waveform of the node N20 can be obtained at the output terminal 27 of the pulse generating device. In the waveform of the node N20, a time width t9 ranging from the leading edge of the pulse input at the node N15 to the leading edge of the pulse at the node N20 can be determined by the reference voltage Vref9 and the time constant which is determined by a resistor R5 and capacitor C4 of the integrating circuit 22, and a time width t10 corresponding to the pulse width at the node N20 can be determined by the reference voltage Vref10 and the time constant which is determined by the resistor R6 and capacitor C5 of the integrating circuit 25.

Thus, in the prior art case, a new and necessary pulse is created by shaping the integrated waveform obtained by integrating the reference pulse by the capacitor C and resistor R by use of the slice level. Therefore, if the value of the capacitor C or resistor R varies, the integration time constant varies and the delay time corresponding to the time width t9 until the slice level is reached varies so that the created pulse phase at the node 20 will vary.

Since the integration time constant is kept unchanged even if the horizontal period of the reference pulse varies twice as shown in FIGS. 9A and 9B, time widths corresponding to t9, t10 are kept unchanged (t11=t13, t12=t14 in FIGS. 9A and 9B). Therefore, the rate of the time widths with respect to one horizontal period (=1 or =2) will vary. Therefore, in order to keep constant the rate of the time widths of t11 and t12 with respect to one horizontal period=1 and time widths of t13 and t14 with respect to one horizontal period=2, it is required to change the values of the capacitor C and resistor R, but this is impossible in practice.

This invention has been made to solve the above problem and an object of this invention is to provide a pulse generating device which can significantly reduce a variation in the phase of a newly created pulse waveform and in which the rate of the pulse width of the newly created pulse waveform with respect to a reference pulse width and the rate of the time width corresponding to the time delay of the created pulse waveform with respect to the reference pulse are precisely correspond to the period of an input pulse.

BRIEF SUMMARY OF THE INVENTION

A pulse generating device of this invention comprises a monostable multivibrator circuit triggered by a rise or fall of an input pulse; an integrating circuit having substantially a constant charging/discharging ratio and including a first capacitor discharged or charged by an output of the monostable multivibrator circuit triggered; a triangular wave generating circuit for generating a triangular wave by triggering the monostable multivibrator circuit when an integrated voltage by the first capacitor of the integrating circuit has reached a first reference voltage and charging or discharging the first capacitor; an AGC circuit constituting a loop which is operated to set the waveform of the triangular wave to a substantially 0V AC potential at a second reference voltage by controlling a charging/discharging current of the integrating circuit according to the result of comparison between the integrated voltage by the first capacitor of the integrating circuit and the second reference voltage; and a pulse generating circuit for generating an output pulse based on of charging/discharging current or charging/ discharging voltage of the integrating circuit controlled by the AGC circuit.

With the above construction, the rate of the rise phase of the newly created pulse waveform with respect to an input pulse and the rate of the pulse width thereof with respect to the period of an input pulse used as a reference can be precisely kept constant.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 9A and 9B are diagrams showing signal waveforms of various portions when one horizontal period in the circuit of FIG. 7 is different.

DETAILED DESCRIPTION OF THE INVENTION

There will now be described a first embodiment of this invention with reference to the accompanying drawings.

Figure 1:
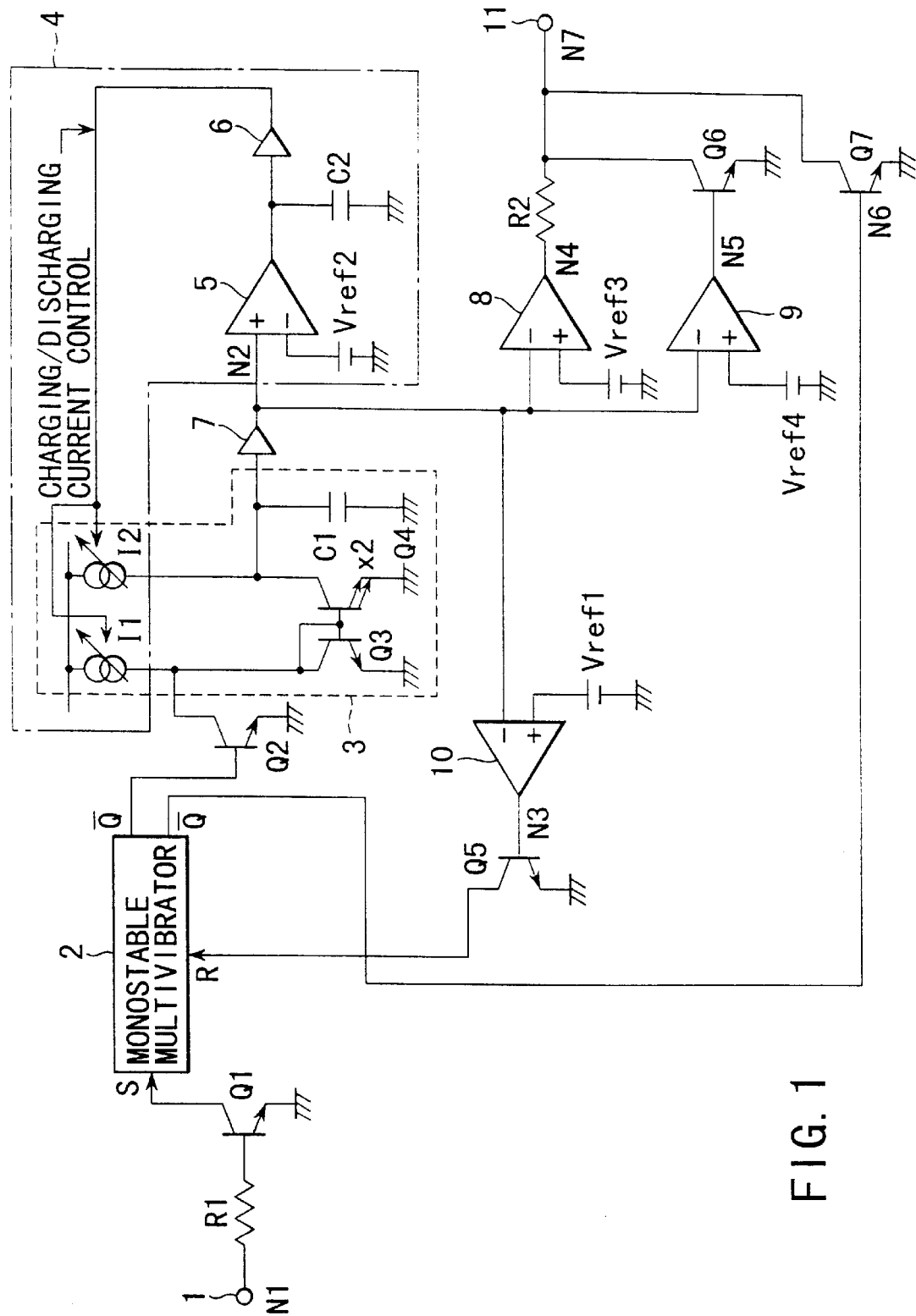
FIG. 1 is a circuit diagram showing the circuit construction of a first embodiment of a pulse generating device of this invention.

FIG. 1 is a circuit diagram showing a pulse generating device of the first embodiment.

In the circuit of FIG. 1, a fly-back pulse generated in a television receiver, for example, is input as a trigger pulse to an input terminal 1 which is a node N1. The input terminal 1 is connected, via a resistor R1, to the base of an NPN transistor Q1 whose emitter is grounded. The collector of the transistor Q1 is connected to the first trigger terminal S of a monostable multivibrator circuit 2.

The first inverted Q output of the monostable multivibrator circuit 2 is connected to the base of an NPN transistor Q2 whose emitter is grounded and the collector thereof is connected to a connection node of the collector of an NPN transistor Q3 and a first current supply I1. This connection node is used as an input terminal of an integrating circuit 3. The integrating circuit 3 includes the first and second current sources I1, I2, NPN transistors Q3, Q4 respectively connected between the current sources I1, I2 and the ground, and an integrating capacitor C1 connected across the transistor Q4. As will be described later in detail, in order to set the current capacity of the NPN transistor Q4 to twice that of the NPN transistor Q3, for example, two transistors connected in parallel (×2) are used as the transistor Q4.

The bases of the NPN transistors Q3, Q4 are connected together via a base connection node which is connected to the collector of the NPN transistor Q3 to make a diode connection of the transistor Q3. The integrating capacitor C1 is connected between a connection node of the second current source I2 and the collector of the NPN transistor Q4 and the ground. The current sources I1, I2 are constituents of an AGC circuit 4 which will be described later.

A connection node of the second current source I2 and the collector of the NPN transistor Q4 is used as the output terminal of the integrating circuit 3 and the output terminal is connected, via a buffer 7, to a node N2 or the non-inverting input terminal of a comparing circuit 5 which is a constituent of the AGC circuit 4. The inverting input terminal of the comparing circuit 5 is supplied with a reference voltage Vref2 from a reference power supply.

The output terminal of the comparing circuit 5 is grounded via a capacitor C2 and commonly connected to the current control terminals of the current sources I1, I2 via a buffer 6. The AGC circuit 4 is constructed by the circuit elements surrounded by a one-dot-dash line.

The output terminal of the buffer 7 is commonly connected to the inverting input terminals of comparing circuits 8, 9, 10, respectively. The non-inverting input terminals of the comparing circuits 8, 9 and 10 are respectively supplied with reference voltages Vref3, Vref4 and Vref1 supplied from reference power supply circuits, respectively. The reference voltages Vref1, Vref3 and Vref4 have the relation of Vref3>Vref4>Vref1 as will be explained later with reference to FIG. 2.

The output terminal of the comparing circuit 10 is a node N3 and it is connected to the base of an NPN transistor Q5 whose emitter is grounded. The collector of the NPN transistor Q5 is connected to the second trigger terminal R of the monostable multivibrator circuit 2.

The output terminal of the comparing circuit 8 is a node N4 and it is connected, via a resistor R2, to a created pulse output terminal 11 which is a node N7. A node N5 or the output terminal of the comparing circuit 9 is connected to the output terminal 11 via the base-collector path of an NPN transistor Q6 whose emitter is grounded. The output terminal 11 is connected to the collector of an NPN transistor Q7 whose base as a node N6 is connected to the second inverted Q output of the monostable multivibrator circuit 2. The emitter of the transistor Q7 is grounded.

In the pulse generating device with the above construction, a fly-back pulse generated in the television receiver is input as a trigger pulse to the monostable multivibrator circuit 2 via the input terminal 1. The first and second inverted Q outputs of the monostable multivibrator circuit 2 are output to the bases of the NPN transistors Q2 and Q7 and are inverted.

The output of the transistor Q2 is connected to the current source I1 and the base and collector of the NPN transistor Q3 and a control signal is supplied therefrom to the integrating circuit 3. The integrating capacitor C1 of the integrating circuit 3 is charged by the current source I2 and discharged by the NPN transistor Q4 and a voltage of the capacitor C1 determined by the charging/discharging operation is commonly output as an output of the integrating circuit 3 to the comparing circuits 5, 8, 9, 10 via the buffer 7.

The comparing circuit 10 compares the output signal of the buffer 7 supplied to the inverting input terminal thereof with the reference voltage Vref1 supplied to the non-inverting input terminal thereof and the comparison output of the comparing circuit 10 is used as a second trigger pulse supplied to the second trigger terminal of the monostable multivibrator circuit 2 via the NPN transistor Q5.

The comparing circuit 5 compares the output signal of the buffer 7 supplied to the non-inverting input terminal thereof with the reference voltage Vref2 supplied to the inverting input terminal thereof, the output of the comparing circuit 5 charges the capacitor C2 and the charging output voltage thereof controls the output current amounts of the current sources I1, I2 via the buffer 6 to increase or decrease at substantially the same rate. Thus, the comparing circuit 5, capacitor C2, buffer 6 and current sources I1, I2 are operated as the AGC circuit 4 for making the amplitude of the output waveform of the integrating circuit 3 substantially constant.

The comparing circuit 8 compares the output signal of the buffer 7 supplied to the inverting input terminal thereof with the reference voltage Vref3 supplied to the non-inverting input terminal thereof and the comparison output of the comparing circuit 8 is supplied to the output terminal 11 via the resistor R2.

The comparing circuit 9 compares the output voltage of the buffer 7 supplied to the inverting input terminal thereof with the reference voltage Vref4 supplied to the non-inverting input terminal thereof and the comparison output of the comparing circuit 9 is supplied to the base of the NPN transistor Q6.

The comparison output of the comparing circuit 8 is supplied to the pulse output terminal 11 via the resistor R2 and added together with an output obtained by inverting the output of the comparing circuit 9 by the NPN transistor Q6 and an output obtained by inverting the output of the monostable multivibrator circuit 2 by the NPN transistor Q7 and the added output is output.

Figure 2:
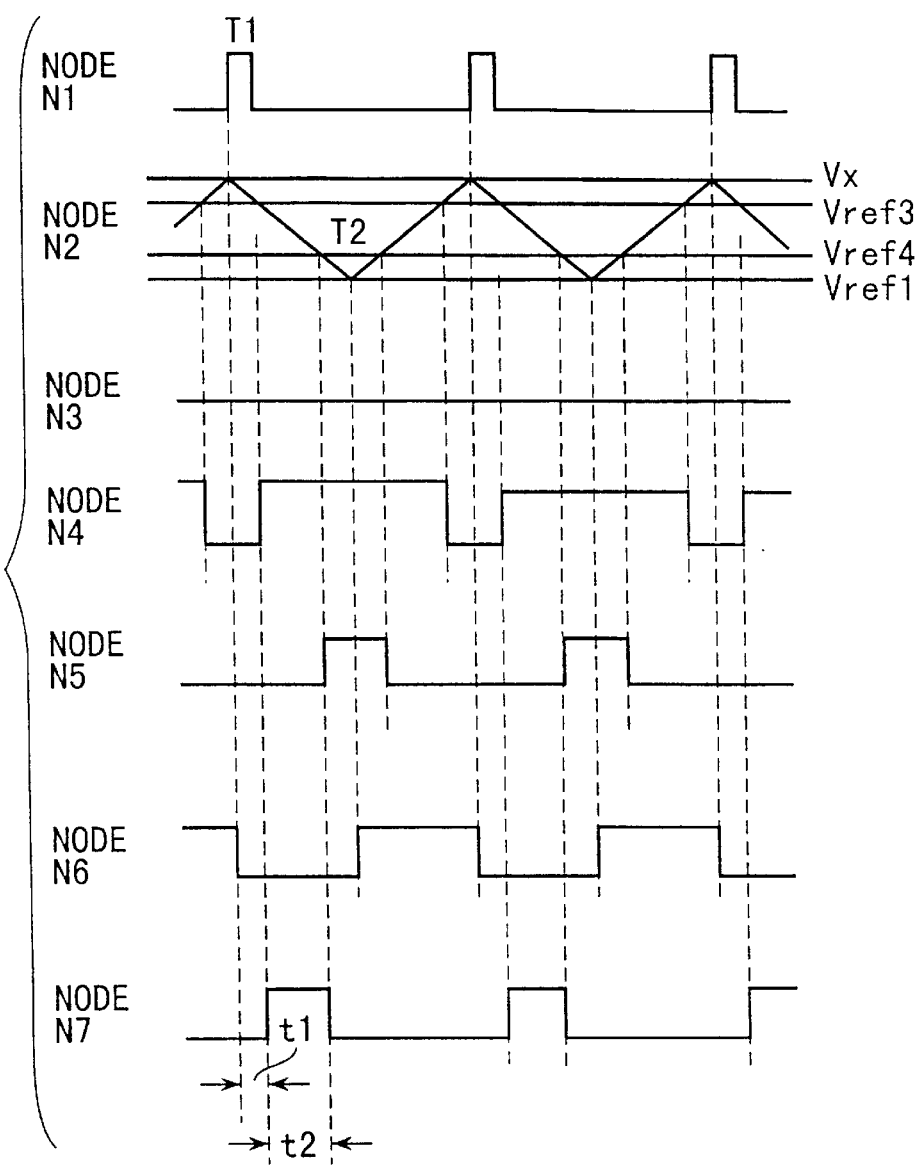
FIG. 2 is a diagram showing signal waveforms of various portions, for illustrating the operation of the circuit of FIG. 1.

FIG. 2 is a diagram showing signal waveforms of various nodes, for illustrating the operation of the pulse generating device of FIG. 1. A fly-back pulse supplied to the node N1 is shown in (a) of FIG. 2 and the output of the integrating circuit 3 supplied via the buffer 7 is shown in (b) of FIG. 2 as a triangular wave at the node N2. The triangular wave output at the node N2 is compared with the slice levels of the reference voltages Vref1, Vref3 and Vref4 in the comparing circuits 10, 8 and 9, respectively.

The falling waveform from the maximum level point T1 of the triangular wave at the node N2 is created by inverting the rise at T1 of the fly-back pulse at the node N1 by use of the NPN transistor Q1, creating a low-level period of the output of the monostable multivibrator circuit 2 by using the inverted phase as a trigger to turn OFF the NPN transistor Q2 and turn ON the NPN transistor Q4, discharging the charges of the capacitor C1 via the NPN transistor Q4, so as to create a discharging waveform from T1 of the node N2 to the minimum level point T2 by the discharging operation.

When the voltage of the node N2 becomes lower than the reference voltage Vref3, the voltage at the node N4 shown in (d) of FIG. 2 rises, thereby causing the output pulse at the node N7 shown in (g) of FIG. 2 to rise. Further, when the voltage of the node N2 becomes lower than the reference voltage Vref4, the voltage of the node N5 shown in (e) of FIG. 2 rises and since the NPN transistor Q6 is turned ON, the output pulse at the node N7 shown in (g) of FIG. 2 falls.

Further, when the voltage of the node N2 becomes lower than the reference voltage Vref1, the output of the comparing circuit 10 at the node N3 is set to the high level at T2 as shown in (c) of FIG. 2 to trigger the R terminal of the monostable multivibrator circuit 2 via the transistor Q5, and as a result, the output of the monostable multivibrator circuit 2 is set to the high level to turn ON the transistor Q2 to lower the base potential of the NPN transistor Q4, thereby turning OFF the transistor Q4. As a result, the operation for charging the capacitor C1 by a current from the current source I2 is started so that the triangular wave voltage will rise as shown in (b) of FIG. 2.

In the rising process, when the reference voltage Vref4 is exceeded by the output triangular wave voltage, the voltage of the node N5 falls and when the reference voltage Vref3 is exceeded, the voltage of the node N4 falls and thus the triangular wave voltage rises until the input pulse of the node N1 rises again.

Figure 3:
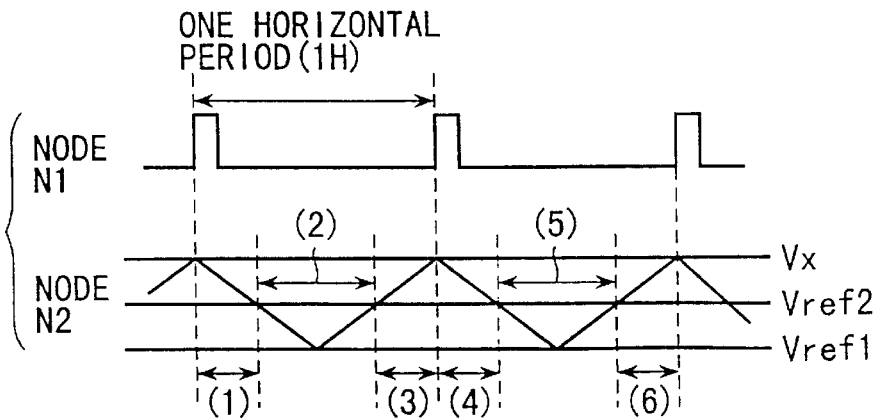
FIG. 3 is a diagram for illustrating the operation of an AGC circuit in the circuit of FIG. 1.

In the above process, the waveform of the triangular wave at the node N2 is controlled by the AGC circuit 4 constructed by the comparing circuit 5, capacitor C2, buffer 6 and current sources I1, I2 so as to attain the relations of period (1)+period (3)=period (2) and period (4)+period (6)=period (5) as shown in FIG. 3. In this case, the periods (1) and (4) indicate the period of time from the maximum level point to Vref2 point in the falling process of the triangular wave, the periods (2) and (5) indicate the period of time from Vref2 point to the minimum level point and then from the minimum level point to Vref2 point, and the periods (3) and (6) indicate the period of time from Vref2 point to the maximum level point in the rising process of the triangular wave.

In this case, if the current supply abilities of the current sources I1, I2 are set to I1=I2, the capacitor C1 is charged by I2 (=I1) with the charging current=I2 and the discharging current (collector current of Q4)=0 in the charging period in which Q4 is set in the ON state. While, the capacitor C1 is discharged by (2I1−I2=I1) with the charging current=I2 and the discharging current (collector current of Q4)=2I1 in the discharging period in which Q4 is set in the OFF state. Thus, the inclinations of the triangular wave at the node N2 are substantially the same in the charging and discharging periods. If the period from the start point of the fly-back pulse at the node N1 to the start point of the next fly-back pulse is 1H, period (1)=period (3)=period (4)=period (6)= 1H/4 and period (2)=period (5)=1H/2.

The maximum level Vx of the triangular wave at the node N2 can be expressed as follows.

$$Vx=Vref1+2*(Vref2-Vref1)$$

$$=2*Vref2-Vref1$$

The output of the comparator 8 at the node N4 is a pulse waveform which is set at the high level in a period in which the level of the waveform of the node N2 obtained by supplying the output of the integrating circuit 3 via the buffer 7 is lower than the reference voltage Vref3. The output of the comparator 9 at the node N5 is a pulse waveform which is set at the high level in a period in which the level of the waveform of the node N2 obtained by supplying the output of the integrating circuit 3 via the buffer 7 is lower than the reference voltage Vref4. A voltage of the base of the transistor Q7 at the node N6 is an output of the monostable multivibrator circuit 2 and is a pulse waveform which is set at the high level in the charging period of the capacitor C1 of the integrating circuit.

The waveform of the node N7 of the pulse output terminal 11 is created by adding the inverted output of the comparing circuit 9 at the node N5 and the inverted output of the monostable multivibrator circuit 2 at the node N6 to the output of the comparing circuit 8 at the node N4. The output pulse waveform has a starting phase delayed by t1 with respect to the rise phase of the fly-back pulse at the node N1 and whose pulse width is t2.

As a result, according to the construction of this embodiment, the delay time t1 and pulse width t2 of the rise phase of the pulse can be expressed as follows based on the relation of Vx, Vref1 and Vref2 shown in FIG. 2, 3.

$$t1=((Vx-Vref3)/(2\times Vx-Vref1))\times H$$

$$=((2\times Vref2-Vref1-Vref3)/(2\times 2Vref2f-Vref1-Vref1))\times H$$

$$=((2\times Vref2-Vref1-Vref3)/(4\times(Vref2-Vref1)))\times H$$

$$t2=((Vx=Vref4)/(2\times Vx=Vref1))\times H-t1=((2\times Vref2-Vref1-Vref4)/(4\times(Vref2-Vref1)))\times H-((2\times Vref2-Vref1-Vref3)/(4\times(Vref2-Vref1)))\times H$$

$$=((Vref3-Vref4)/(4\times(Vref2-Vref1)))\times H$$

In the above equations of t1 and t2, H indicates a time interval of one horizontal period of the input fly-back pulse. The above equations of t1 and t2 indicate that t1 and t2 are determined only by the horizontal period H and reference voltages which are used as the slice levels of the respective comparing circuits, and it is understood that a pulse generating device in which the output pulse phase and output pulse width will not vary can be attained if each of the reference voltages can be derived from circuits such as constant voltage sources outputting stable voltages.

As is understood from the explanation of FIG. 3, the loop of the AGC circuit 4 is operated so that the waveform of the triangular wave of the node N2 will be set to the approx. 0V AC potential at the reference voltage Vref2.

Figure 4:
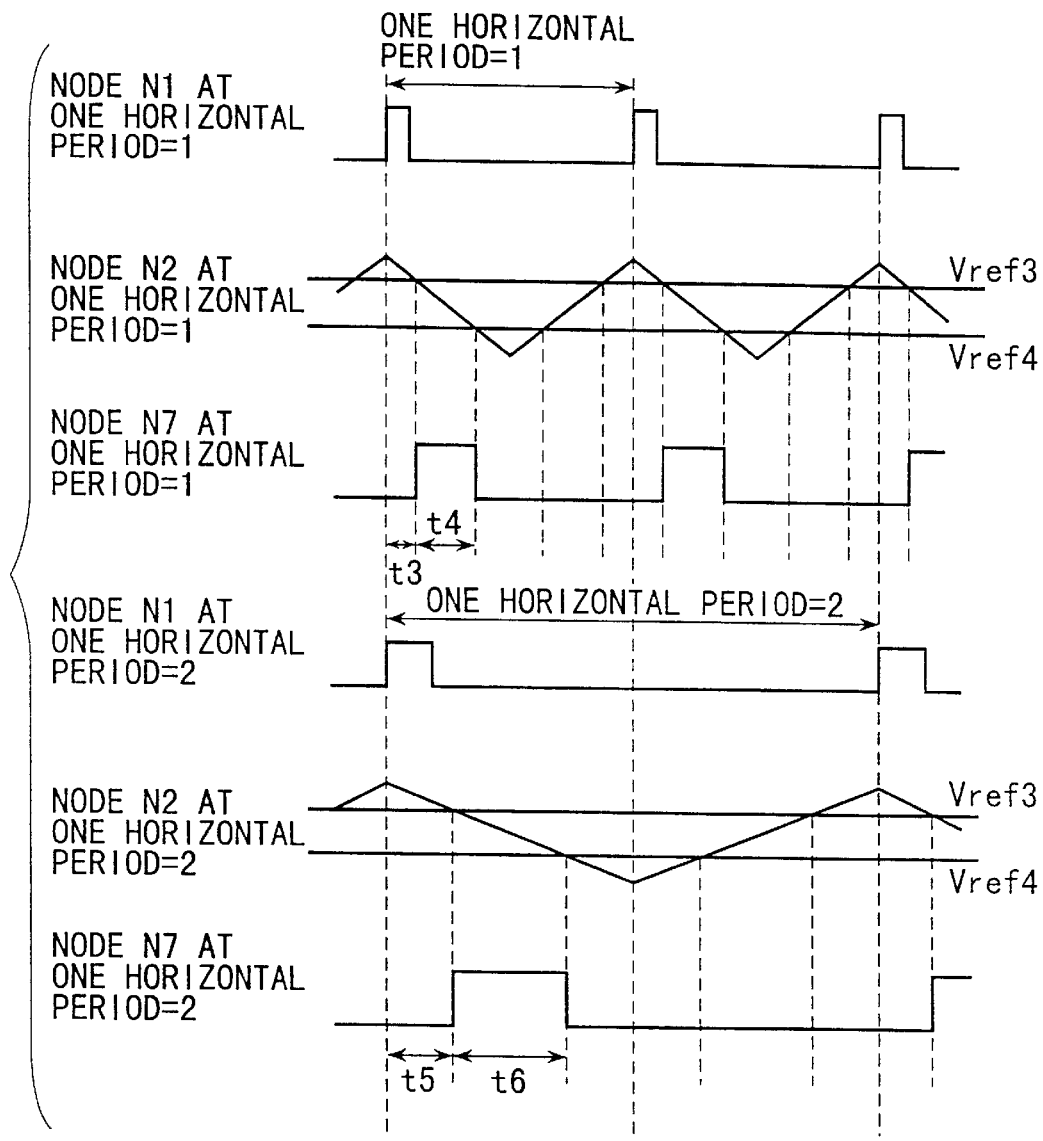
FIG. 4 is a diagram showing signal waveforms of various portions when the horizontal period in the circuit of FIG. 1 is different.

The above equations of t1 and t2 indicate that the rates t1/H and t2/H of t1 and t2 to one horizontal period H can be kept constant even if one horizontal period H is changed and a pulse output can be provided in which the rates of t1 and t2 to one horizontal period H can be kept substantially constant even if one horizontal period H is changed. FIG. 4 shows a case in which one horizontal period H is changed from H=1 to H=2. Namely, when H=1 is changed to H=2, the time widths t3 and t4 are changed to time widths t5 (=2t3) and t6 (2t4), respectively.

In the embodiment described with reference to FIGS. 1 to 4, the monostable multivibrator circuit 2 is triggered by the rise of the input pulse at the node N1, but it is of course possible to trigger the same by the fall of the input pulse, thereby effecting the similar operation.

Figure 5:
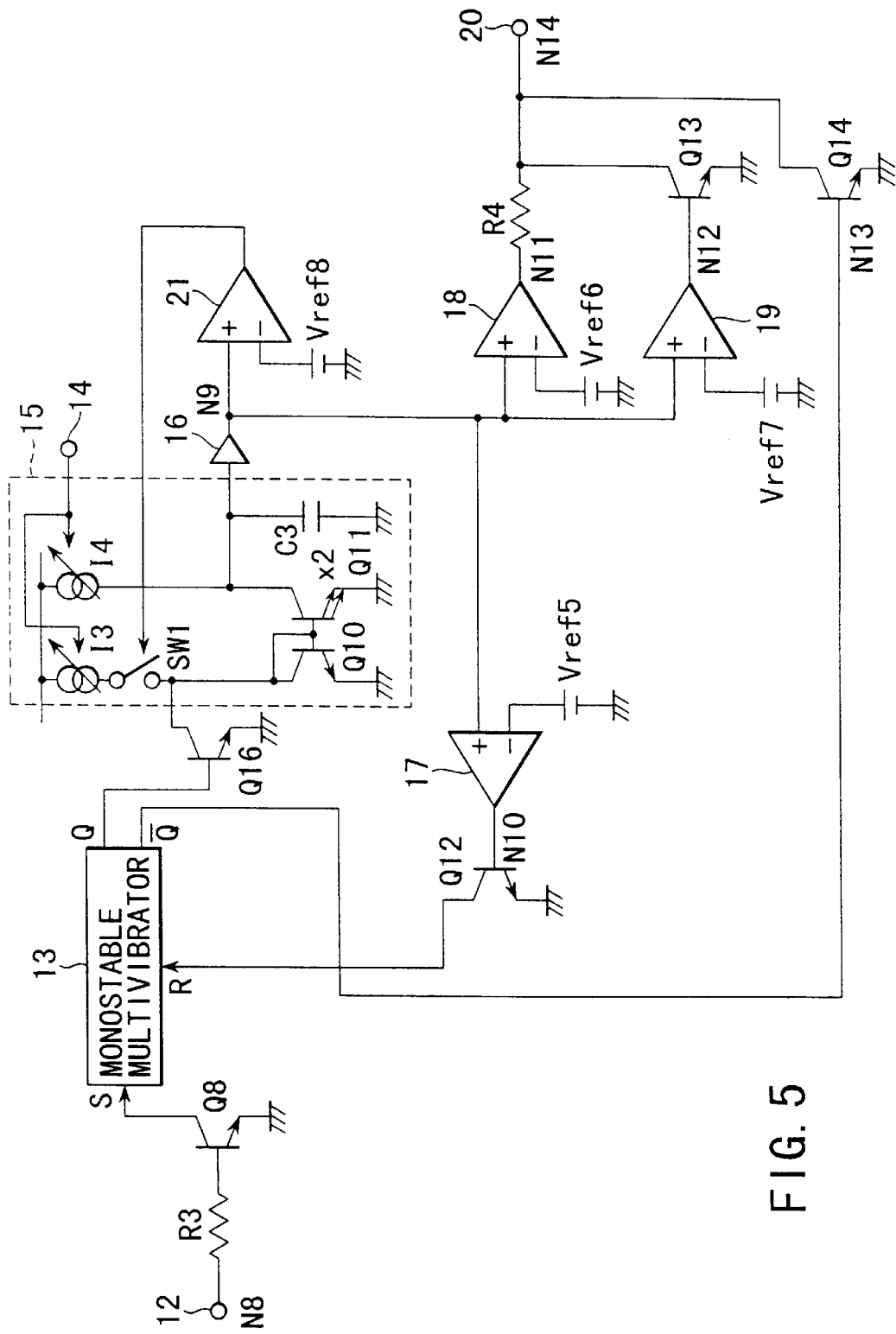
FIG. 5 is a circuit diagram showing the circuit construction of a second embodiment of a pulse generating device of this invention.

FIG. 5 is a circuit diagram showing a second embodiment of this invention. In the second embodiment, a basic pulse which is different from the fly-back pulse is used as the basic pulse for creating the pulse. In the following explanation, portions which are the same as those of FIG. 1 are denoted by the same reference numerals and the detail explanation therefor is omitted.

Like the integrating circuit 3 shown in FIG. 1, in an integrating circuit 15 having an AGC function, a charging/discharging current control signal is supplied to current sources I3, I4 via a terminal 14. The basic pulse is supplied to a terminal 12 (node N8) and is used as a trigger pulse of a monostable multivibrator circuit 13. The Q output and an inverted Q output of the monostable multivibrator circuit 13 are respectively output to the bases of NPN transistors Q16 and Q14. The base of the transistor Q14 is denoted as a node N13.

The output of the transistor Q16 is connected to a switch SW1 and the base and collector of an NPN transistor Q10, so that a control signal is supplied therefrom to the integrating circuit 15. The integrating circuit 15 has a capacitor C3 and the current source I4 and NPN transistor Q11 supply a charging/discharging current of the capacitor C3.

An output signal of the integrating circuit 15 is output via a buffer 16. A comparing circuit 17 is supplied with the output signal via the buffer 16 at the non-inverting input terminal thereof and supplied with a reference voltage Vref5 at the inverting input terminal thereof. An output of the comparing circuit 17 is supplied to the monostable multivibrator circuit 13 via an NPN transistor Q12 and used as a second trigger pulse thereof.

A comparing circuit 21 is supplied with the output signal of the buffer 16 at the non-inverting input terminal thereof and supplied with a reference voltage Vref8 at the inverting input terminal thereof. The output of the comparing circuit 21 is connected to the control terminal of the switch SW1 to control the open/closed state of the switch SW1 according to the output voltage thereof.

The switch SW1 is turned ON when the output of the comparing circuit 21 is set at the high level to turn ON the transistor Q11 to discharge the capacitor C3 via the transistor Q11.

A comparing circuit 18 is supplied with the output signal of the buffer 16 at the non-inverting input terminal thereof and supplied with a reference voltage Vref6 at the inverting input terminal thereof. A comparing circuit 19 is supplied with the output signal of the buffer 16 at the non-inverting input terminal thereof and supplied with a reference voltage Vref7 at the inverting input terminal thereof. An output of the comparing circuit 18 is supplied to a pulse output terminal 20 via a resistor R4 after it is added to an inverted output obtained by inverting an output of the comparing circuit 19 by the transistor Q13 and an inverted output obtained by inverting an output of the monostable multivibrator circuit 13 by the transistor Q14.

Figure 6:
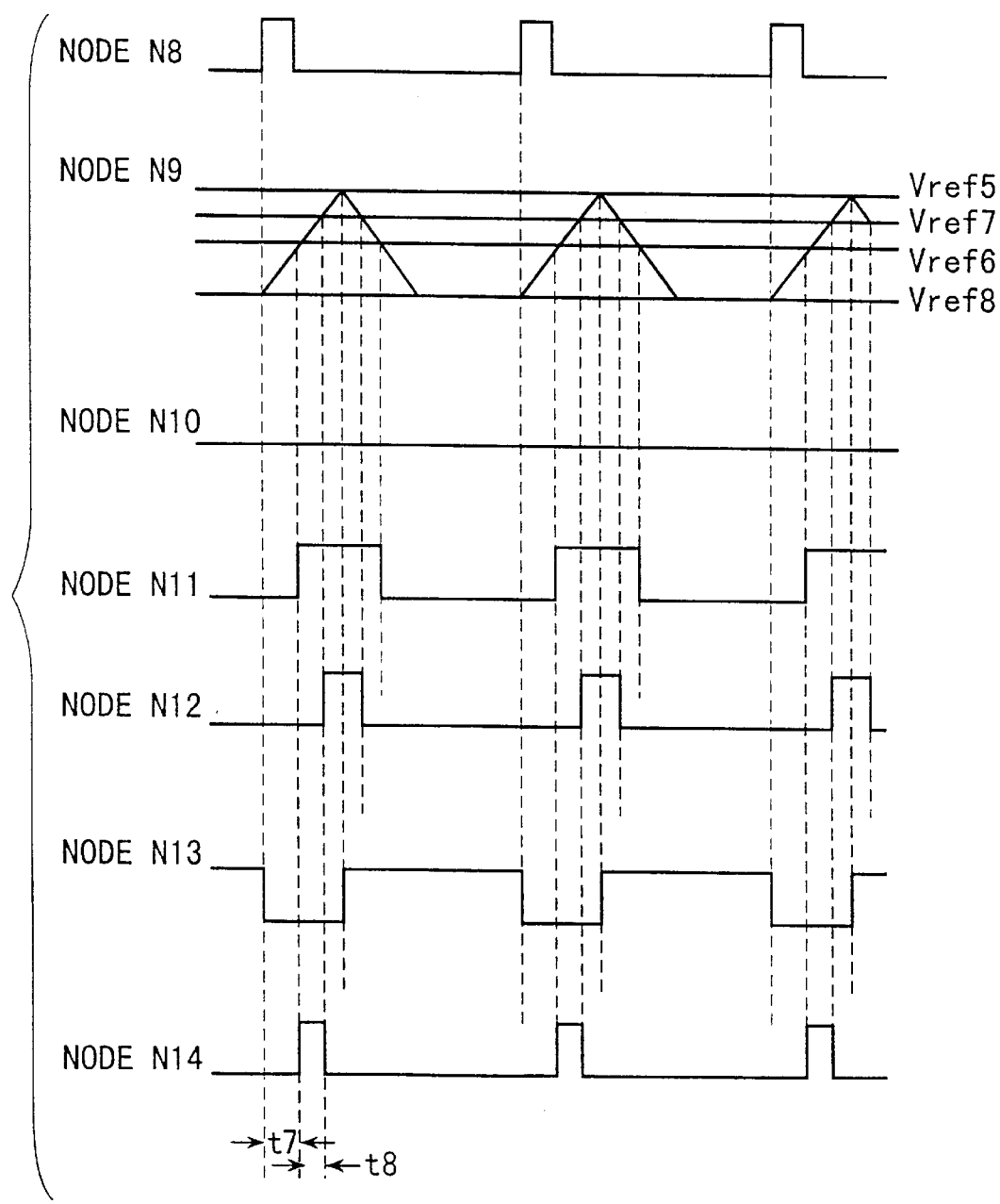
FIG. 6 is a diagram showing signal waveforms of various portions, for illustrating the operation of the circuit of FIG. 5.
Figure 7:
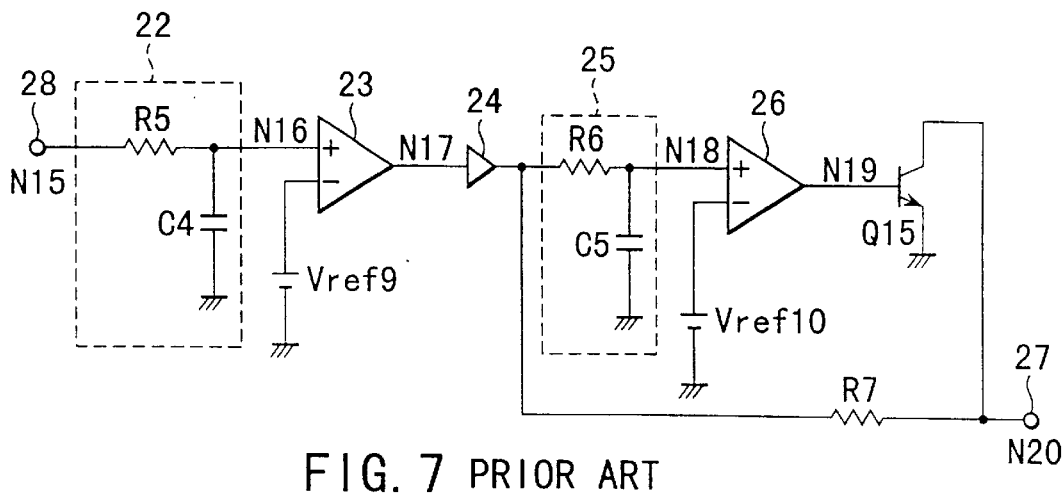
FIG. 7 is a circuit diagram showing one example of the construction of the conventional pulse generating device.
Figure 8:
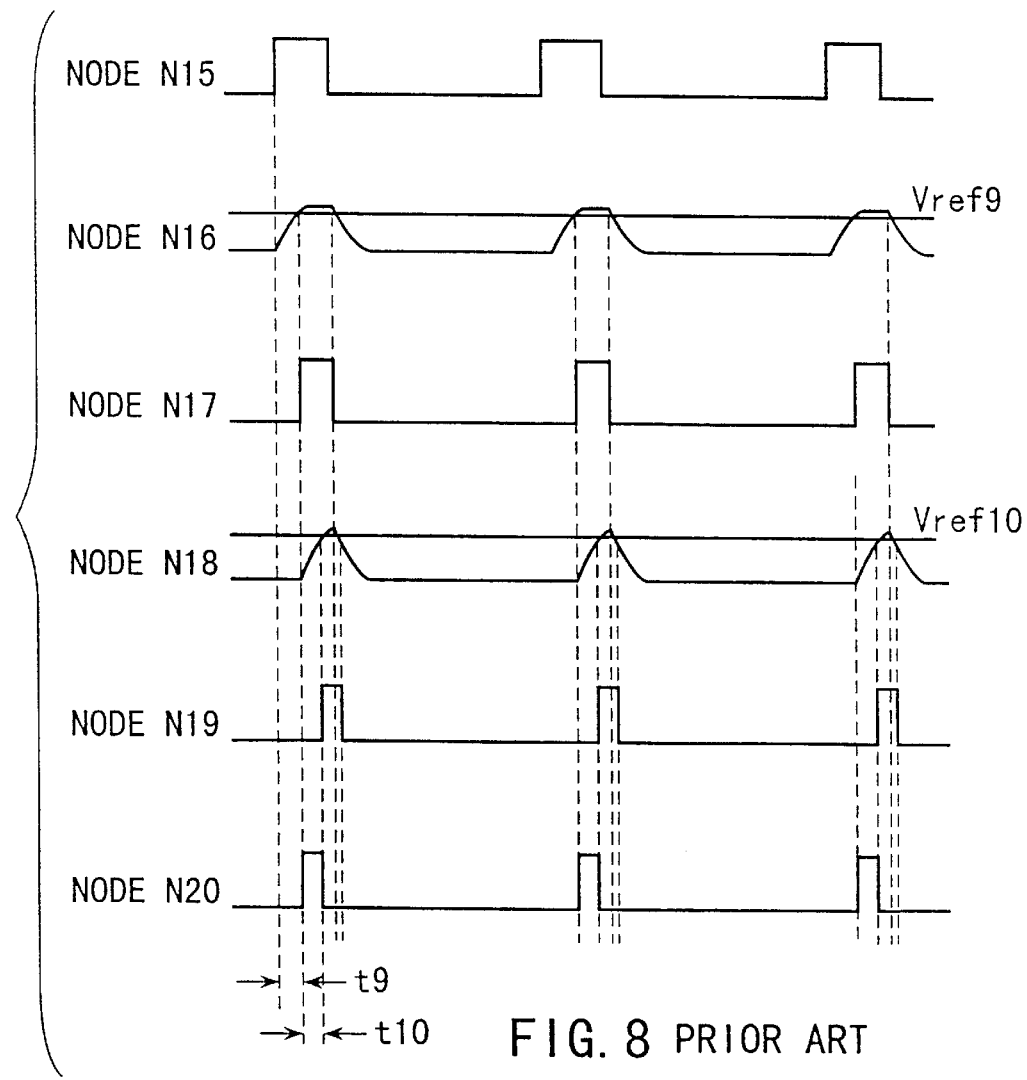
FIG. 8 is a diagram showing signal waveforms of various portions, for illustrating the operation of the circuit of FIG. 7.

FIG. 6 is a diagram showing signal waveforms of various nodes, for illustrating the operation of the pulse generating device of FIG. 5. An input pulse to the node N8 of the input terminal 12 is shown in (a) of FIG. 6 and a triangular wave is obtained at the node N9 by supplying an output of the integrating circuit 15 via the buffer 16 as shown in (b) of FIG. 6 together with slice levels of reference voltages Vref5, Vref6, Vref7, Vref8. The waveform of the node N9 obtained by supplying the output of the integrating circuit 15 via the buffer 16 is a triangular wave which rises while the capacitor C3 is charged in a period in which the output of the monostable multivibrator circuit 13 triggered by the rise phase of the basic pulse of the node N8 is kept at the high level and then falls when the comparator 17 detects that the voltage at the node N9 exceeds the reference voltage Vref5, an output of a node N10 of the comparing circuit 17 shown in (c) of FIG. 6 is set at the high level to trigger the monostable multivibrator circuit 13 via the transistor Q12, and the output of the triggered monostable multivibrator circuit 13 is set at the low level to discharge the capacitor C3.

If the waveform of the node N9 becomes lower than the reference voltage Vref8 of the comparing circuit 21, an output of the comparing circuit 21 is set to the low level to turn OFF the switch SW1 and the capacitor C3 is charged, but the level of the waveform of the node N9 instantly exceeds Vref8 to turn ON the switch SW1 and the capacitor C3 starts to be discharged. Therefore, the low level of the waveform of the node N9 is kept substantially constant at the reference voltage Vref8.

An output of the node N11 of the comparing circuit 18 shown in (d) of FIG. 6 is a pulse waveform which is set at the high level in a period in which the level of the waveform of the node N9 obtained by supplying the output of the integrating circuit 15 via the buffer 16 is higher than the reference voltage Vref6. An output of the node N12 of the comparing circuit 19 shown in (e) of FIG. 6 is a pulse waveform which is set at the high level in a period in which the level of the waveform of the node N9 obtained by supplying the output of the integrating circuit 15 via the buffer 16 is higher than the reference voltage Vref7.

An output of the node N13 of the base of the transistor Q14 shown in (f) of FIG. 6 is a pulse waveform which is set at the high level in a period in which the base potential of the transistor Q16 for controlling the integrating circuit 15 according to the inverted Q output of the monostable multivibrator circuit 13 is set at the low level.

The waveform of the node N14 of the output terminal 20 shown in (g) of FIG. 6 is a pulse waveform which is created by adding the waveform of the output node N11 of the comparing circuit 18 to the inverted form of the waveform of the output node N12 of the comparing circuit 19 and the inverted form of the waveform of the output node N13 of the monostable multivibrator circuit 13 and in which the pulse width is t8 and the starting phase is delayed by t7 with respect to the rise phase of the basic pulse of the node N8.

In the embodiment of FIGS. 5 and 6, since the triangular waveform with the preset charging/discharging time constant which is irrespective of the period of the basic pulse input to the node N8 is obtained at the node N9, the rise time t7 and pulse width t8 of the output pulse at the node N14 can be set to desired values by setting the inclination of the rise of the triangular wave to a preset value by controlling the output current values of the current sources I1, I2 according to the AGC control signal supplied to the terminal 14. Further, since the integrated waveform of the triangular wave can be precisely defined by the AGC circuit irrespective of the CR time constant used in the conventional circuit, the rise phase and pulse width of the output pulse can be precisely set.

As described above, according to this invention, in a pulse generating device for generating a triangular wave in the integrating circuit by controlling the integrating circuit by use of the monostable multivibrator circuit which is supplied with, for example, a fly-back pulse generated in the television receiver set as a trigger signal and using the result of comparison for an output of the integrating circuit in the comparing circuit as a second trigger of the monostable multivibrator circuit, the phase variation of the output pulse caused by a variation in the CR time constant can be significantly reduced and the rise phase and pulse width of a newly created pulse waveform vary at substantially the same rate according to a variation in the period of an input pulse which is used as a reference by AGC-controlling the charging/discharging current of the integrating circuit by use of the AGC circuit and creating a pulse by use of the integrated waveform of the integrating circuit which is AGC-controlled.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pulse generating device comprising:
    a monostable multivibrator circuit triggered by a rise or fall of an input pulse;
    an integrating circuit having substantially a constant charging/discharging ratio and including a first capacitor discharged or charged by an output of said monostable multivibrator circuit triggered;
    a triangular wave generating circuit for generating a triangular wave by triggering said monostable multivibrator circuit when an integrated voltage by said first capacitor of said integrating circuit has reached a first reference voltage and charging or discharging said first capacitor;
    an AGC circuit constituting a loop which is operated to set the waveform of the triangular wave to a substantially 0V AC potential at a second reference voltage by controlling a charging/discharging current of said integrating circuit according to the result of comparison between the integrated voltage by said first capacitor of said integrating circuit and the second reference voltage; and
    a pulse generating circuit for generating an output pulse based on of charging/discharging current or charging/discharging voltage of said integrating circuit controlled by said AGC circuit.

2. The pulse generating device according to claim 1, wherein the charging/discharging ratio of said integrating circuit is 1:1.

3. The pulse generating device according to claim 1, wherein t1/H and t2/H are substantially constant if delay time from the starting end of a rising or falling ramp of the triangular wave to the starting end of a pulse generated from said pulse generating circuit is t1, a pulse width of the pulse is t2 and a period of the input pulse is H.

4. The pulse generating device according to claim 1, wherein said integrating circuit includes an integrating capacitor element, a charging circuit for supplying a charging current to said integrating capacitor element, a discharging circuit connected in parallel with said integrating capacitor element, and a discharge control circuit for operating said discharging circuit according to an output of said monostable multivibrator circuit to discharge charges of said integrating capacitor element.

5. The pulse generating device according to claim 4, wherein said discharge control circuit includes a first current source and a first transistor connected in series with said first current source, said charging circuit includes a second current source connected in series with said integrating capacitor element, said discharging circuit includes a second transistor connected in parallel with said integrating capacitor element, said first and second transistors have control terminals connected to each other and the potential of the control terminals is controlled according to the output of said monostable multivibrator circuit.

6. The pulse generating device according to claim 5, wherein said AGC circuit includes a comparing circuit for comparing an output voltage of said integrating circuit with said second reference voltage, and a charging/discharging current control circuit for controlling the currents of said first and second current sources according to an output of said comparing circuit.

7. The pulse generating device according to claim 1, wherein said pulse generating circuit includes a first comparing circuit for comparing an output of said integrating circuit with a first slice level, a second comparing circuit for comparing the output of said integrating circuit with a second slice level, and an output creating circuit for combining outputs of said first and second comparing circuits to create the output pulse.

8. A pulse generating device comprising:
    a monostable multivibrator circuit triggered by a rise or fall of an input pulse;
    an integrating circuit having a variable time constant and including a first capacitor discharged or charged by an output of said monostable multivibrator circuit;
    a triangular wave generating circuit for generating a triangular wave with a preset period by triggering said monostable multivibrator circuit when an integrated voltage by said first capacitor of said integrating circuit has reached a first reference voltage and charging or discharging said first capacitor;
    a control circuit for setting an integrated waveform output from said integrating circuit to substantially a constant level at a second reference voltage by controlling a charging/discharging current of said integrating circuit according to the result of comparison between the integrated voltage by said first capacitor of said integrating circuit and the second reference voltage; and a pulse generating circuit for generating an output pulse based on a charging/discharging current or charging/discharging voltage of said integrating circuit.

9. The pulse generating device according to claim 8, wherein a charging/discharging ratio-of said integrating circuit is 1:1.

10. The pulse generating device according to claim 8, wherein said integrating circuit includes an integrating capacitor element, a charging circuit for supplying a charging current to said integrating capacitor element, a discharging circuit connected in parallel with said integrating capacitor element, and a discharge control circuit for operating said discharging circuit according to an output of said monostable multivibrator circuit to discharge charges of said integrating capacitor element.

11. The pulse generating device according to claim 10, wherein said discharge control circuit includes a first current source and a first transistor connected in series with said first current source, said charging circuit includes a second current source connected in series with said integrating capacitor element, said discharging circuit includes a second transistor connected in parallel with said integrating capacitor element, said first and second transistors have control terminals connected to each other and the potential of the control terminals is controlled according the an output of said monostable multivibrator circuit.

12. The pulse generating device according to claim 11, wherein said integrating circuit is caused to vary time constant thereof when currents of the first and second current sources are controlled by an AGC control signal supplied therewith.

13. The pulse generating device according to claim 11, wherein said control circuit includes a comparing circuit which compares an output voltage of said integrating circuit with said second reference voltage, and a switch element connected between said first current source and said first transistor to be ON/OFF-controlled according to an output of said comparing circuit.

14. The pulse generating device according to claim 8, wherein said pulse generating circuit includes a first comparing circuit for comparing an output of said integrating circuit with a first slice level, a second comparing circuit for comparing the output of said integrating circuit with a second slice level, and an output creating circuit for combining outputs of said first and second comparing circuits to create the output pulse.

15. A pulse generating device comprising:

a monostable multivibrator circuit triggered by a rise or fall of an input pulse;

an integrating circuit having substantially a constant charging/discharging ratio and including a first capacitor discharged or charged by an output of said monostable multivibrator circuit triggered;

a triangular wave generating circuit which generates a triangular wave by triggering said monostable multivibrator circuit when an integrated voltage by said first capacitor of said integrating circuit has reached a first reference voltage and charging or discharging said first capacitor;

an AGC circuit constituting a loop which is operated to set the waveform of the triangular wave to a substantially 0V AC potential at a second reference voltage by controlling a charging/discharging current of said integrating circuit according to an output voltage of a second capacitor whose charging/discharging operation is controlled by the result of comparison between the integrated voltage by said first capacitor of said integrating circuit and the second reference voltage; and a pulse generating circuit for generating an output pulse based on of charging/discharging current or charging/discharging voltage of said integrating circuit controlled by said AGC circuit.

16. The pulse generating device according to claim 15, wherein the charging/discharging ratio of said integrating circuit is 1:1.

17. The pulse generating device according to claim 15, wherein t1/H and t2/H are substantially constant if delay time from the starting end of a rising or falling ramp of the triangular wave to the starting end of a pulse generated from said pulse generating circuit is t1, a pulse width of the pulse is t2 and a period of the input pulse is H.

18. The pulse generating device according to claim 15, wherein said integrating circuit includes an integrating capacitor element, a charging circuit for supplying a charging current to said integrating capacitor element, a discharging circuit connected in parallel with said integrating capacitor element, and a discharge control circuit for operating said discharging circuit according to an output of said monostable multivibrator circuit to discharge charges of said integrating capacitor element.

19. The pulse generating device according to claim 18, wherein said discharge control circuit includes a first current source and a first transistor connected in series with said first current source, said charging circuit includes a second current source connected in series with said integrating capacitor element, said discharging circuit includes a second transistor connected in parallel with said integrating capacitor element, said first and second transistors have control terminals connected to each other and the potential of the control terminals is controlled according to the output of said monostable multivibrator discharge control circuit.

20. The pulse generating device according to claim 15, wherein said pulse generating circuit includes a first comparing circuit for comparing an output of said integrating circuit with a first slice level, a second comparing circuit for comparing the output of said integrating circuit with a second slice level, and an output creating circuit for combining outputs of said first and second comparing circuits to create the output pulse.

* * * * *